(12) United States Patent
Nakamura

(10) Patent No.: US 8,257,604 B2
(45) Date of Patent: Sep. 4, 2012

(54) ETCHING PROCESSING METHOD

(75) Inventor: Norikazu Nakamura, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 1048 days.

(21) Appl. No.: 12/196,467

(22) Filed: Aug. 22, 2008

(65) Prior Publication Data

US 2009/0057270 A1 Mar. 5, 2009

(30) Foreign Application Priority Data

Aug. 27, 2007 (JP) ................................ 2007-219792

(51) Int. Cl.
*B44C 1/22* (2006.01)
(52) U.S. Cl. ........................................... 216/83; 216/93
(58) Field of Classification Search .................. None
See application file for complete search history.

(56) References Cited

U.S. PATENT DOCUMENTS

| | | | | |
|---|---|---|---|---|
| 4,073,740 A | * | 2/1978 | Polichette et al. | 252/186.43 |
| 4,698,124 A | * | 10/1987 | Krulik | 216/93 |
| 4,911,802 A | * | 3/1990 | D'Ambrisi | 205/475 |
| 4,948,630 A | * | 8/1990 | Courduvelis et al. | 427/444 |
| 4,952,852 A | * | 8/1990 | Bando et al. | 318/140 |
| 6,454,868 B1 | * | 9/2002 | Polakovic et al. | 134/2 |
| 7,695,638 B2 | * | 4/2010 | Nakamura et al. | 252/79.1 |
| 2003/0141198 A1 | * | 7/2003 | De Boer et al. | 205/475 |
| 2008/0124258 A1 | | 5/2008 | Nakamura et al. | |

FOREIGN PATENT DOCUMENTS

| | | |
|---|---|---|
| JP | 2001-156428 | 6/2001 |
| JP | 2008-153640 | 7/2008 |

OTHER PUBLICATIONS

Japanese Office Action (English Translation); Patent Application No. 2007-219792, issued Nov. 25, 2011, nine pages.

* cited by examiner

*Primary Examiner* — Anita Alanko

(74) *Attorney, Agent, or Firm* — Rankin, Hill & Clark LLP

(57) ABSTRACT

The etching processing method is characterized in that, when performing an etching processing on a resin member by using a desmear liquid containing an alkaline permanganate etching liquid, the etching processing is performed by dipping the resin member into the desmear liquid of which an etching rate for a resin forming the resin member is adjusted by using at least one of an accelerator for accelerating the etching rate of the desmear liquid and a suppressor for suppressing the etching rate.

4 Claims, 4 Drawing Sheets

(AT 5000-TIMES POWER)

ETCHING PROCESSING METHOD

BACKGROUND OF THE INVENTION

This invention relates to an etching processing method and, more specifically, to an etching processing method for performing an etching processing on a resin member with the use of a desmear liquid comprising an alkaline permanganate etching liquid.

In the field of wiring boards, in order to improve peeling strength of a copper film formed on a surface of a resin member of a resin plate or the like by copper plating, etching is performed on the surface of the resin member for roughening the surface.

Such roughening is generally performed by way of an etching processing on the resin member surface, wherein the resin member is dipped into a desmear liquid comprising an alkaline permanganate etching liquid.

A degree of irregularity of the resin member surface relates to the thus-roughened resin member and the peeling strength of the copper film formed by the copper plating. Since it is difficult to check the irregularity degree of the resin member surface during the etching processing, the irregularity degree is controlled by way of an etching time depending on an etching rate of the desmear liquid. Therefore, the desmear liquid is required to have an appropriate etching rate.

When the etching processing of dipping the resin member into the desmear liquid is performed for a certain times, carbonate ions are accumulated in the desmear liquid as described in Patent Publication 1. In the desmear liquid in which carbonate ions are accumulated, the etching rate is accelerated to be out of the appropriate etching rate range, thereby making it impossible to control the degree of irregularity to be formed on the resin member surface. Therefore, the desmear liquid in which a predetermined amount of carbonate ions are accumulated is discarded.

The discarded desmear liquid is reused as proposed in Patent Publication 1 by adding barium chloride to the desmear liquid to change the carbonate ions in the desmear liquid into hardly soluble barium carbonate and then removing the barium carbonate by ultrafiltration.

[Patent Publication 1] JP-A-2001-156428

According to Patent Publication 1, it is possible to reuse the desmear liquid that is not capable of controlling the degree of irregularity to be formed on the resin member surface due to the accelerated etching rate caused by the carbonate ion accumulation.

However, in view of the fact that it is necessary to stop the etching processing during desmear liquid replacing work, it is considered that it is possible to improve operation efficiency of the etching processing when life of the desmear liquid is lengthened as long as possible.

Also, even when the desmear liquid has the predetermined etching rate, the adjustment of time for dipping the resin member into the desmear liquid that is conducted for adjusting the degree of irregularity to be formed on the resin member surface makes etching processing management complicated and also complicates managements in a pre-processing and a post-processing of the etching processing.

SUMMARY OF THE INVENTION

Therefore, in order to solve the problems of the conventional etching processing such as the necessity of adjustment of the time for dipping the resin member into the desmear liquid for adjusting the degree of irregularity formed on the resin member surface and the short desmear liquid life, an object of this invention is to provide an etching processing method that makes it possible to easily adjust a degree of irregularity formed on a resin member surface in a given resin member dipping time during which the resin member is dipped into a desmear liquid as well as to lengthen life of the desmear liquid.

The inventor had considered that removal of carbonate ions accumulated in a desmear liquid due to the resin member etching processing might be effective for lengthening life of the desmear liquid and added barium chloride used in Patent Publication 1 for the removal of carbonate ions in the desmear liquid to the desmear liquid in which carbonate ions are accumulated.

However, despite a reduction of the carbonate ions in the desmear liquid, it is found that the etching rate is scarcely or never reduced in the case where the barium chloride that is generated and precipitated in the desmear liquid is not removed.

The inventor conducts a further research to find that the etching rate of the desmear liquid in which carbonate ions are accumulated is suppressed when calcium hydroxide [$Ca(OH)_2$] is added to the desmear liquid without removing generated calcium carbonate.

Also, the inventor increases an amount of a permanganate compound in order to improve an etching rate of a desmear liquid to find that irregularity formed on a resin member surface is roughened though the etching rate of the desmear liquid is improved.

The inventor conducts a yet further research on a desmear liquid capable of improving an etching rate and forming fine irregularity on a surface of a resin member without increasing an amount of permanganate compound to be added to find that a desmear liquid to which sodium carbonate ($Na_2CO_3$) is added enables acceleration of the resin member etching rate as well as of formation of fine irregularity on the resin surface, thereby accomplishing this invention.

According to a first aspect of the invention, there is provided a method for etching a resin member, including the steps of:

preparing a desmear liquid including an alkaline permanganate etching liquid, and dipping the resin member into the desmear liquid of which an etching rate for a resin forming the resin member is adjusted by using at least one of an accelerator for accelerating the etching rate of the desmear liquid and a suppressor for suppressing the etching rate thereof.

According to a second aspect of the invention, there is provided the method according to the first aspect, wherein the accelerator is a carbonate compound that is dissolved into the desmear liquid to generate carbonate ions ($CO_3^{2-}$).

According to a third aspect of the invention, there is provided the method according to the first or the second aspect, wherein the accelerator is sodium carbonate ($Na_2CO_3$)

According to a forth aspect of the invention, there is provided the method according to any one of the first to the third aspects, wherein the suppressor is a calcium compound that is dissolved into the desmear liquid to generate calcium ions ($Ca^{2+}$)

According to a fifth aspect of the invention, there is provided the method according to any one of the first to the forth aspects, wherein the suppressor is calcium hydroxide [$Ca(OH)_2$].

According to a sixth aspect of the invention, there is provided the method according to the first aspect, wherein if the etching rate of the desmear liquid is out of a controllable range, the accelerator or the suppressor is added to the desmear liquid.

According to this invention, it is possible to perform an etching processing by dipping a resin member into a desmear liquid having an etching rate adjusted by using an accelerator for accelerating etching rate and a suppressor for suppressing etching rate.

Therefore, when changing a degree of irregularity to be formed on a surface of the resin member, it is possible to adjust the etching rate by adding the accelerator or the suppressor to the desmear liquid so as to form irregularity having a desired size on the resin member surface in a predetermined etching processing time. As a result, it is possible to form the irregularity of desired size on the resin member surface without changing the etching processing time during which the resin member is dipped into the desmear liquid.

Also, addition of the suppressor makes it possible to suppress an etching rate of a desmear liquid that is no longer usable for controlling the degree of irregularity to be formed on the resin member surface due to an accelerated etching rate caused by accumulation of carbonate ions generated by receptive etching processings. As a result, it is possible to lengthen life of the desmear liquid and to improve operation efficiency of the etching process.

DETAILED DESCRIPTION OF THE PREFERRED EMBODIMENTS

Figure 1:
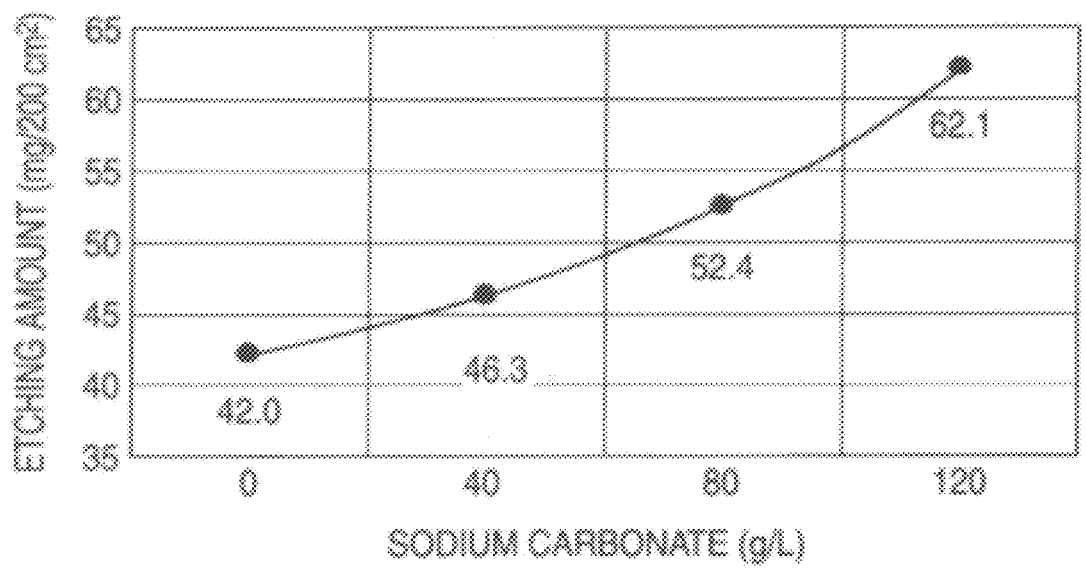
FIG. 1 is a graph showing a relationship between an amount of sodium carbonate added to a desmear liquid containing an alkaline permanganate liquid and an etching amount of a resin substrate.

A desmear liquid to be used in this invention is an alkaline permanganate etching liquid. As the alkaline permanganate etching liquid, an aqueous solution obtained by imparting a strong alkaline property (pH 13.3 to 13.8) to sodium permanganate or potassium permanganate with sodium hydroxide may preferably be used.

In this invention, an etching rate of the desmear liquid with respect to a resin forming a resin member is adjusted by using at least one of an accelerator accelerating etching rate and a suppressor suppressing etching rate.

As the accelerator, a carbonate compound that is dissolved in the desmear liquid to generate carbonate ions ($CO_3^{2-}$), particularly sodium carbonate ($Na_2CO_3$), may preferably be used.

As the suppressor, a calcium compound that is dissolved in the desmear liquid to generate calcium ions ($Ca^{2+}$), particularly calcium hydroxide [$Ca(OH)_2$], may preferably be used.

In the case of performing the etching processing by dipping a resin member into such desmear liquid, a resin member that has undergone an alkali swelling treatment is dipped into the desmear liquid of which a temperature is adjusted to 75° C. to 85° C. for a predetermined period of time. After termination of the predetermined etching processing time, the resin member is taken out of the desmear liquid, followed by washing with water, neutralization of permanganic acid, washing with water, and drying.

An etching rate when performing such etching processing on the resin member may be accelerated in the case where it is desired to increase a degree of irregularity to be formed on a surface of the resin member by using the desmear liquid of the predetermined etching rate and without lengthening the etching processing time.

In such case, it is possible to accelerate the etching rate of the desmear liquid by adding the carbonate compound that is dissolved in the desmear liquid to generate carbonate ions ($CO_3^{2-}$), such as sodium carbonate ($Na_2CO_3$), to the desmear liquid. Thus, it is possible to increase the degree of irregularity to be formed on the resin member surface without lengthening the etching processing time.

Also, in the case of returning the etching rate of the desmear liquid that is accelerated in etching rate to the etching rate before the addition of sodium carbonate ($Na_2CO_3$) used as the accelerator, it is possible to restore the original level of the etching rate of the desmear liquid by adding the calcium compound that is dissolved in the desmear liquid to generate calcium ions ($Ca^{2+}$), such as calcium hydroxide [$Ca(OH)_2$], to the desmear liquid. Thus, it is possible to perform the etching processing on the resin member without changing the desmear liquid.

Further, it is possible to restore a level of controllable etching rate by adding the calcium compound that is dissolved in the desmear liquid to generate calcium ions ($Ca^{2+}$), such as calcium hydroxide [$Ca(OH)_2$], to a desmear liquid that is otherwise discarded because of an etching rate that cannot be controlled due to accumulation of carbonate ions ($Co_3^{2-}$). Thus, it is possible to lengthen life of the desmear liquid.

Embodiment 1

After subjecting a 10-cm-square resin substrate (having a surface area of 200 cm$^2$) made from a filler-containing epoxy-based organic resin to an alkali swelling treatment by dipping into an alkaline solution containing sodium hydroxide as a main component, the resin substrate is washed with water, and then an etching processing is performed on the resin substrate.

In the etching processing, the resin substrate subjected to the alkali swelling treatment is dipped into a desmear liquid for 20 minutes. The desmear liquid is an alkaline permanganate liquid obtained by adding 39 g/L of sodium hydroxide to a solution in which sodium permanganate is dissolved at a proportion of 65 g/L and maintained to 80° C.

After washing the resin substrate undergone the etching processing and taken out from the desmear liquid with water, the resin substrate is subjected to a permanganic acid neutralization treatment, followed by further washing with water and drying at a room temperature.

After that, the resin substrate is dried at 120° C. for 5 minutes, and a weight thereof is measured as a weight after etching processing.

A difference between the weight after etching processing and a weight before processing, which is a weight of the resin substrate measured before the alkali swelling treatment, is considered as an etching processing weight. The etching processing weight is converted into an etching amount per 200 $cm^2$ of surface area (mg/200 $cm^2$) of the resin substrate.

In the case where nothing is added to the desmear liquid, the etching amount is 42.0 mg/200 $cm^2$.

Etching amounts of resin substrates in the case of varying an amount of sodium carbonate added to the desmear liquid are measured in the same manner as in the case of adding nothing to the desmear liquid, and results thereof are shown in FIG. 1. In FIG. 1, the horizontal axis indicates the amounts of added sodium carbonate (g/L), and the vertical axis indicates the etching amounts (mg/200 $cm^2$).

Figure 2:
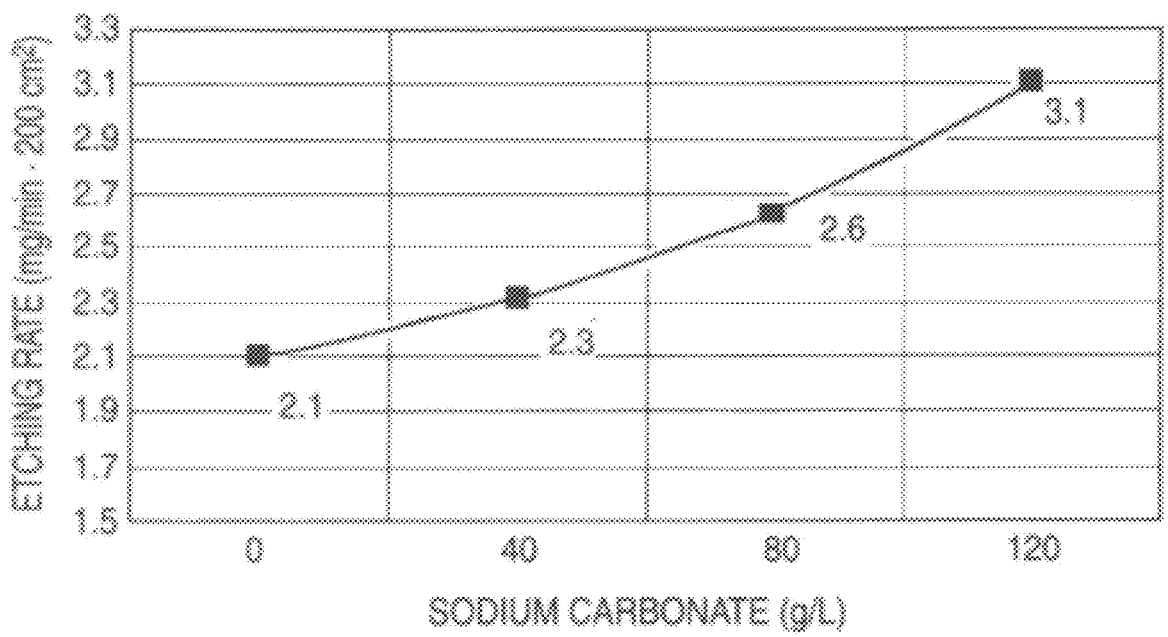
FIG. 2 is a graph showing a relationship between an amount of sodium carbonate added to a desmear liquid containing an alkaline permanganate liquid and an etching rate of a resin substrate.

As is apparent from FIG. 1, the etching amount is increased with an increase in amount of sodium carbonate added to the desmear liquid. Results of conversion of the etching amounts into etching rates are shown in FIG. 2. In FIG. 2, the horizontal axis indicates the amounts of added sodium carbonate (g/L), and the vertical axis indicates the etching rates (mg/min·200 $cm^2$).

As shown in FIG. 2, the etching rate is increased with an increase in amount of sodium carbonate added to the desmear liquid. (However, the etching rate is not linearly increased.) Therefore, sodium carbonate is an accelerator accelerating the etching rate of the desmear liquid.

Since the etching rate is increased by the addition of sodium carbonate as described above, it is possible to increase irregularity to be formed on the surface of the resin substrate while maintaining the constant etching processing time by adding the predetermined amount of sodium carbonate to the desmear liquid.

Embodiment 2

Figure 3:
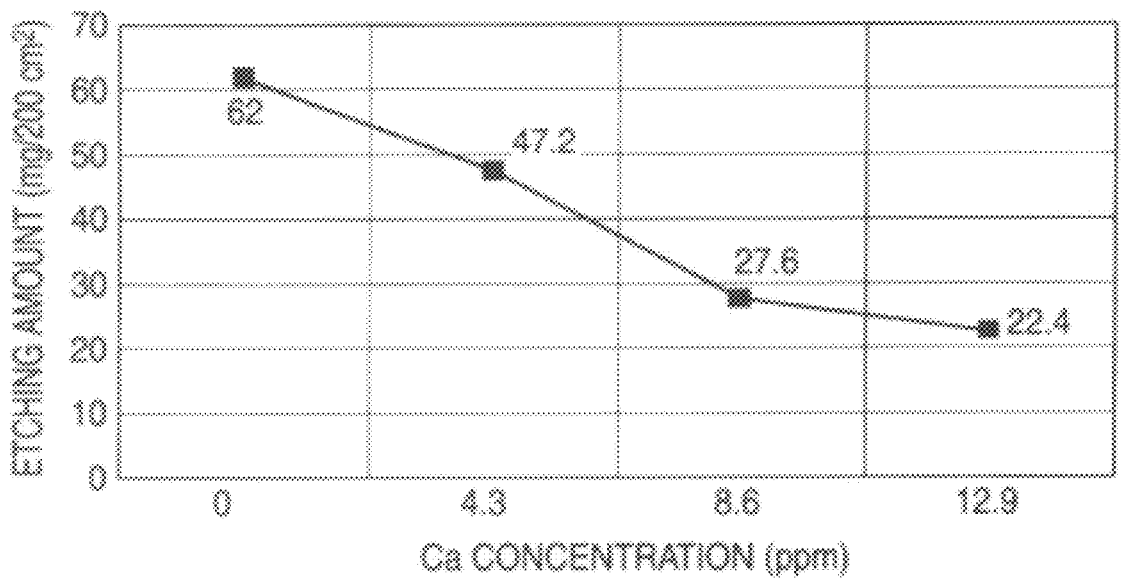
FIG. 3 is a graph showing a relationship between a calcium concentration of a desmear liquid containing an alkaline permanganate liquid and an etching amount of a resin substrate.

Calcium hydroxide [$Ca(OH)_2$] is added to the desmear liquid containing the alkaline permanganate liquid used in Embodiment 1, and etching amounts of 5-cm-square resin substrates (having a surface area of 50 $cm^2$) are measured in the same manner as in Embodiment 1. Each of the etching amounts is converted into an etching amount per 200 $cm^2$ of surface area (mg/200 $cm^2$) of the resin substrate, and the converted etching amounts are shown in FIG. 3. In FIG. 3, the horizontal axis indicates the amounts of added calcium hydroxide converted into calcium (Ca) concentrations (ppm), and the vertical axis indicates the etching amounts (mg/200 $cm^2$).

Figure 4:
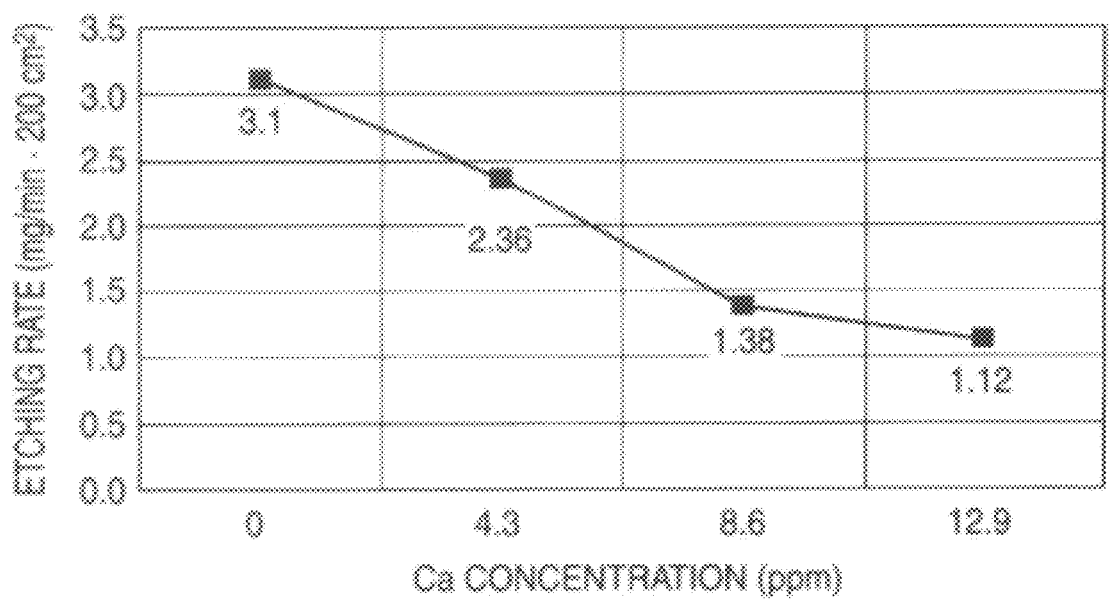
FIG. 4 is a graph showing a relationship between a calcium concentration of a desmear liquid containing an alkaline permanganate liquid and an etching rate of a resin substrate.

Further, results obtained by converting the etching amounts into etching rates are shown in FIG. 4. In FIG. 4, the horizontal axis indicates the amounts of added calcium hydroxide converted into calcium (Ca) concentrations (ppm), and the vertical axis indicates the etching rates (mg/min·200 $cm^2$).

The etching amount and the etching rate of the desmear liquid of FIGS. 3 and 4 to which calcium hydroxide is not added (Ca concentration: 0) are substantially the same as those of the desmear liquid of FIGS. 1 and 2 to which 120 g/L of sodium carbonate is added.

The etching rate is reduced by adding calcium hydroxide to the desmear liquid. More specifically, when 4 ppm (calcium concentration) of calcium hydroxide is added to the desmear liquid, the etching amount is reduced to 17.2 mg/200 $cm^2$.

Therefore, calcium hydroxide is a suppressor suppressing the etching rate of the desmear liquid.

Since the etching rate is suppressed by the addition of calcium hydroxide as described above, the addition of calcium hydroxide makes it possible to return an etching rate of a desmear liquid that is otherwise discarded because of an etching rate that cannot be controlled due to accumulation of carbonate ions to a controllable etching rate. Consequently, it is possible to lengthen life of the desmear liquid.

Embodiment 3

Figure 5A:
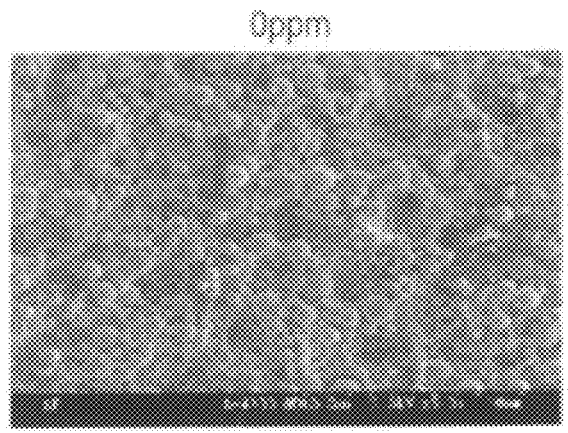
FIGS. 5A to 5C are SEM photographs each showing a relationship between a calcium concentration of a desmear liquid containing an alkaline permanganate liquid and a surface state of a resin substrate after etching processing.

An etching processing is performed by using the desmear liquid containing the alkaline permanganate liquid used in Embodiment 1 in the same manner as in Embodiment 1, and a SEM photograph at 5000-times power of a surface state of a resin substrate after the etching processing is shown in FIG. 5A.

Figure 5B:
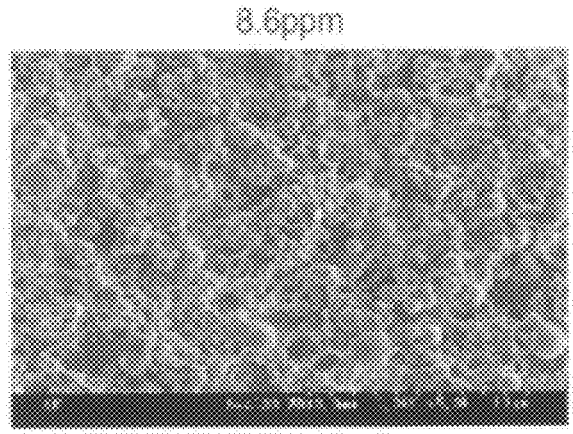
Figure 5C:
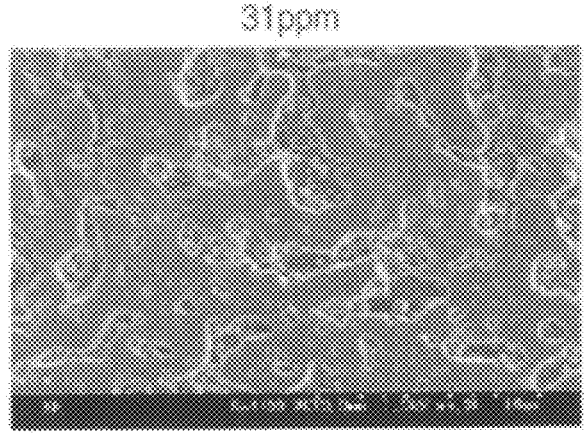

Also, a SEM photograph at 5000-times power of a surface state of a resin substrate that is subjected to an etching processing performed by adding 8.6 ppm (calcium concentration) of calcium hydroxide to the desmear liquid containing the alkaline permanganate liquid used in Embodiment 1 is shown in FIG. 5B, and a SEM photograph at 5000-times power of a surface state of a resin substrate that is subjected to an etching processing performed by adding 31 ppm (calcium concentration) of calcium hydroxide to the desmear liquid containing the alkaline permanganate liquid used in Embodiment 1 is shown in FIG. 5C.

Referring to the surface state of the resin substrate shown in FIG. 5A, irregularity of the resin substrate that underwent the etching processing of being dipped into the desmear liquid to which calcium hydroxide is added as the suppressor suppressing the etching rate is suppressed along with the increase in amount of added calcium hydroxide. (This phenomenon is caused, since $Ca^{2+}$ suppresses oxidizing power of $Mn^{7+}$.)

Therefore, it is possible to adjust the irregularity degree of the resin substrate surface by controlling the etching rate of the desmear liquid by adjusting the amount of calcium hydroxide to be added.

Embodiment 4

After subjecting a resin substrate to an etching processing in the same manner as in Embodiment 2 by using the desmear liquid containing the alkaline permanganate liquid used in Embodiment 1, surface roughness of the resin substrate and peeling strength of a copper plated film are measured. The surface roughness of the resin substrate is measured by employing a laser non-contact surface roughness measurement apparatus (manufactured by Veeco, WYKO NY-8000), and the peeling strength of the copper plated film is measured by using a measurement apparatus (EZ Graph) manufactured by Shimadzu Corporation.

As the copper plating, a copper plated film having a thickness of 35 μm is formed by electrolytic copper plating wherein an electroless copper plated film formed by electroless copper plating is obtained as a power feeding layer on a resin substrate that is taken out from the desmear liquid after the etching processing and then subjected to washing with water, a permanganic acid neutralization treatment, washing with water, and drying at room temperature.

Surface roughness of a resin substrate that underwent an etching processing using a desmear liquid to which calcium hydroxide is not added is 0.4 μm, and peeling strength of a copper plated film of the resin substrate is 1 kgf/cm.

Also, surface roughness of a resin substrate that underwent an etching processing using a desmear liquid to which 3.8 ppm of calcium hydroxide is added is 0.37 μm, and peeling strength of a copper plated film of the resin substrate is 0.9 kgf/cm.

As shown in FIGS. 3 and 4, the etching amount and the etching rate are linearly reduced within the calcium concentration range of 0 to 8.6 ppm of the desmear liquid. Therefore, under an assumption that the peeling strength of the copper plated film is also reduced linearly within the calcium concentration range of 0 to 8.6 ppm of the desmear liquid, it is possible to estimate the peeling strength of the copper plated film at 8 ppm or less of the calcium concentration of the desmear liquid to be 0.8 kgf/cm from the results obtained at the calcium concentrations of 0 ppm and 3.8 ppm of the desmear liquid.

Note that peeling strength of a copper plated film is required to be 0.8 kgf/cm or more in the field of wiring substrates.

Embodiment 5

Hereinafter, adjustment of etching rate achieved by adding sodium carbonate that is the etching rate accelerator and calcium hydroxide that is the etching rate suppressor to a desmear liquid containing an alkaline permanganate liquid will be described.

Figure 6:
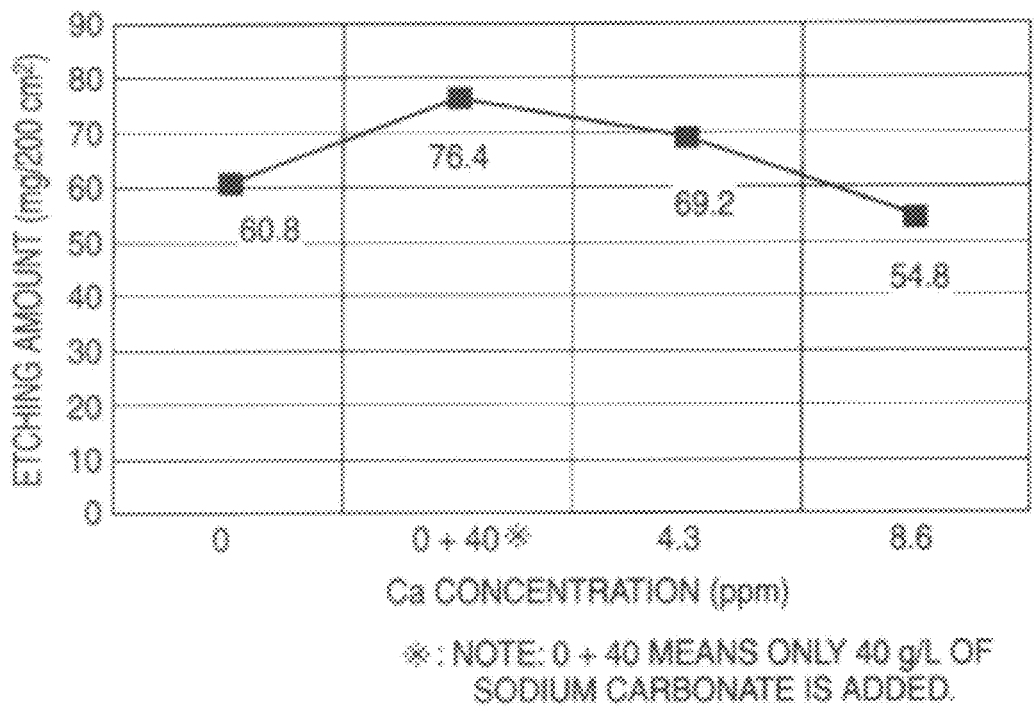
FIG. 6 is a graph showing a relationship between a sodium carbonate added amount/a calcium concentration of a desmear liquid containing an alkaline permanganate liquid and an etching amount of a resin substrate.

An etching processing is performed by dipping a 5-cm-square resin substrate (surface area: 50 cm$^2$) to the desmear liquid containing the alkaline permanganate liquid used in Embodiment 1 for 20 minutes, and an etching amount is measured in the same manner as in Embodiment 1, thereby detecting an etching amount of 60.8 mg/200 cm$^2$ as shown in FIG. 6.

After adding 40 g/L of sodium carbonate to the desmear liquid, an etching amount is measured by performing an etching processing by dipping a 5-cm-square resin substrate (surface area: 50 cm$^2$) to the thus-obtained desmear liquid for 20 minutes. The detected etching amount is 76.4 mg/200 cm$^2$ that is increased (etching rate is accelerated) as compared to that achieved by the desmear liquid before the addition of sodium carbonate as shown in FIG. 6.

When calcium hydroxide is added in an amount equivalent to 4.3 ppm in Ca concentration to the desmear liquid of which the etching rate is accelerated, an etching amount of a resin substrate (surface area: 50 cm$^2$) is suppressed (etching rate is suppressed) to 69.2 mg/200 cm$^2$ as shown in FIG. 6.

Further, when calcium hydroxide is added in an amount equivalent to 8.6 ppm in Ca concentration to the desmear liquid of which the etching rate is accelerated, an etching amount of a resin substrate (surface area: 50 cm$^2$) is further suppressed (etching rate is suppressed) to 54.8 mg/200 cm$^2$ as shown in FIG. 6. (However, the etching rate is not linearly increased.)

As described above, it is possible to increase the etching rate of the desmear liquid for the resin substrate by adding sodium carbonate to the desmear liquid. Also, the addition of calcium hydroxide makes it possible to reduce the etching rate of the desmear liquid that is increased in etching rate by the addition of sodium carbonate.

Therefore, it is possible to adjust the etching rate of the desmear liquid to a desired range by adding sodium carbonate and calcium hydroxide to the desmear liquid.

COMPARATIVE EXAMPLE

Barium chloride that are heretofore used for removing carbonate ions accumulated in a desmear liquid containing an alkaline permanganate liquid is added to a desmear liquid containing the alkaline permanganate liquid used in Embodiment 1, and an etching processing is performed by dipping a resin substrate (surface area: 50 cm$^2$) to the thus-obtained desmear liquid for 20 minutes without eliminating precipitates such as barium carbonate generated therein, followed by a measurement of an etching amount of the resin substrate in the same manner as in Embodiment 1.

Further, an etching amount of a resin substrate (surface area: 50 cm$^2$) is measured by changing the amount of barium chloride added to the desmear liquid. Results thereof are shown in FIG. 7.

Figure 7:
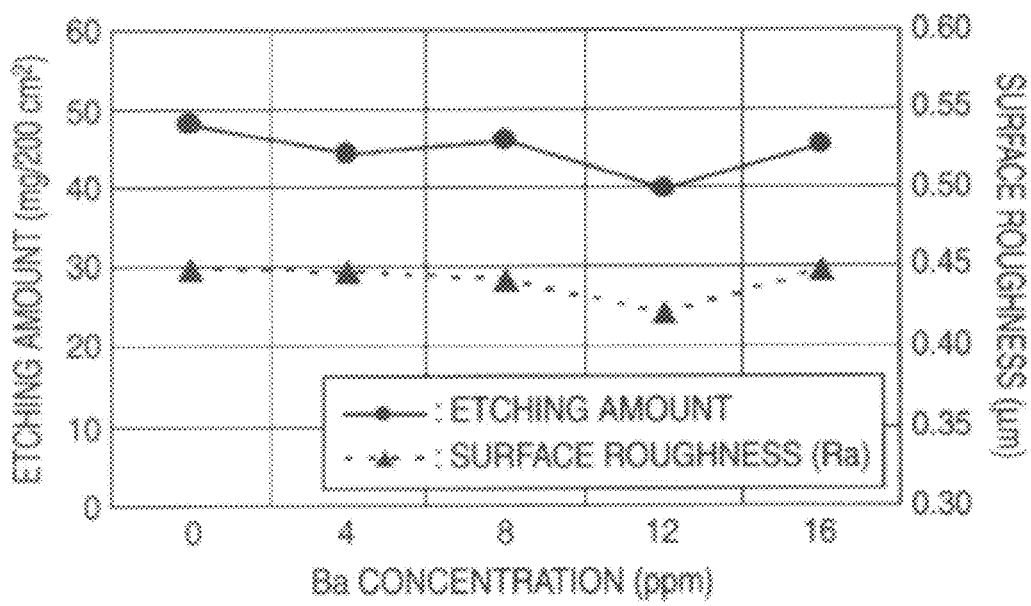
FIG. 7 is a graph showing a relationship among a barium concentration of barium chloride added to a desmear liquid containing alkaline permanganate liquid, a resin substrate etching amount, and resin substrate surface roughness.

As is apparent from FIG. 7, even when the carbonate ions are removed by adding barium chloride to the desmear liquid, the etching amount of the resin substrate in the case of not eliminating the precipitates such as barium carbonate is almost the same as that achieved when barium chloride is not added.

Also, as shown in FIG. 7, surface roughnesses of the resin substrates undergone the etching processings are almost the same.

What is claimed is:

1. A method for etching a resin member formed of an epoxy resin, comprising the steps of:
    preparing a desmear liquid including an aqueous solution obtained by imparting an alkaline property to sodium permanganate or potassium permanganate with sodium hydroxide, a temperature of the desmear liquid being in a range of 75 degrees Celsius to 85 degrees Celsius,
    determining that an etching rate of the desmear liquid for the rein member is below a desired range, and when the etching rate of the desmear liquid for the resin member is below the desired range, adding an accelerator composition to accelerate the etching rate, the accelerator composition being sodium carbonate ($Na_2CO_3$) that generates carbonate ions ($CO_3^{2-}$) when dissolved into the desmear liquid, wherein the etching rate of the desmear liquid increases as a concentration of the accelerator composition increases,
    determining that the etching rate of the desmear liquid for the rein member is above the desired range, and when the etching rate of the desmear liquid for the resin member is above the desired range, adding a suppressor composition to suppress the etching rate, the suppressor composition being calcium hydroxide [$Ca(OH)_2$] that generates calcium ions ($Ca^{2+}$) when dissolved into the desmear liquid, wherein the etching rate of the desmear liquid decreases as a concentration of the suppressor composition increases, and
    dipping the resin member into the desmear liquid.
2. The method according to claim 1, wherein preparing the desmear liquid includes adding the accelerator composition or the suppressor composition to the desmear liquid if the etching rate of the desmear liquid is out of a controllable range.
3. The method according to claim 1, further comprising the steps of:
    after dipping the resin member into the desmear liquid, further adding one of the accelerator composition to accelerate the etching rate of the desmear liquid and the suppressor composition to suppress the etching rate of the desmear liquid, and
    after further adding the one of the accelerator composition and the suppressor composition, dipping another resin member into the desmear liquid.
4. The method according to claim 1, wherein preparing the desmear liquid including the aqueous solution includes providing the aqueous solution with a pH in a range of 13.3 to 13.8.

* * * * *